United States Patent [19]

Hartmann et al.

[11] Patent Number: 4,672,313

[45] Date of Patent: Jun. 9, 1987

[54] DEVICE FOR CHECKING MOBILE ELECTRICAL CHARGES IN A MOS INTEGRATED CIRCUIT

[75] Inventors: Joël Hartmann, Claix; Pierre Jeuch, Seyssins, both of France

[73] Assignee: Commissariat a l'Energie Atomique, Paris, France

[21] Appl. No.: 580,840

[22] Filed: Feb. 16, 1984

[30] Foreign Application Priority Data

Feb. 24, 1983 [FR] France ................ 83 03046

[51] Int. Cl.⁴ .............. G01R 31/22; G01R 15/12; G01R 31/02
[52] U.S. Cl. .............. 324/158 F; 324/158 P; 324/73 PC; 324/72.5
[58] Field of Search ........... 324/158 F, 158 P, 158 D, 324/73 PC, 72.5; 339/117 R, 117 P; 200/83 N

[56] References Cited

U.S. PATENT DOCUMENTS 3,405,361 10/1968 Kattner et al. ............ 324/158 P
3,596,228 7/1971 Reed, Jr. et al. ............ 324/158 F
3,949,295 4/1976 Moorshead ............ 324/158 F
3,979,671 9/1976 Meeker et al. ............ 324/158 F
4,340,860 7/1982 Teeple, Jr. ............ 324/158 F

OTHER PUBLICATIONS

IBM Technical Disclosure Bulletin, vol. 16, No. 2, Jul. 1973, N.Y. (US), H. W. Curtis et al, "Probe Analysis Technique for Semiconductor Testing", pp. 692-693.
IBM Technical Disclosure Bulletin, vol. 14, No. 6, Nov. 1971, N.Y. (US), R. Hammer, "High-Temperature Multicontact Test Probe", pp. 1924, 1925.

Primary Examiner—Reinhard J. Eisenzopf
Assistant Examiner—Vinh P. Nguyen
Attorney, Agent, or Firm—Oblon, Fisher, Spivak, McClelland & Maier

[57] ABSTRACT

A device for checking the mobile electrical charges in a MOS integrated circuit having a wafer support, a polarization means applying a potential difference between the two faces of the silicon wafer on which are formed the integrated circuits by means of two electrodes, one constituted by a conductive diaphragm covering the silicon wafer and which is kept in contact with the silicon wafer by a pressure difference between these two faces, while the other is constituted by the electrically conductive wafer support.

5 Claims, 3 Drawing Figures

DEVICE FOR CHECKING MOBILE ELECTRICAL CHARGES IN A MOS INTEGRATED CIRCUIT

BACKGROUND OF THE INVENTION

1. Field of the Invention

The present invention relates to a device for checking mobile electrical charges in a MOS integrated circuit.

2. Discussion of Background

The elements of integrated circuits, such as MOS transistor grids are formed by superimposing three layers, namely a metal layer M forming the grid electrode, an oxide layer 0 and a layer S constituting the doped silicon wafer. The oxide layer 0 contains the mobile ionized impurities which, trapped in the oxide, can migrate and behave in the same way as mobile electrical charges. As a function of the potential difference applied between the metal electrode and the semiconductor layer, they move towards the metal-oxide boundary or the oxide-semiconductor boundary.

As is known, a three-stage process is used for revealing the mobile electrical charges. In a first stage, for each of the points of the integrated circuit which it is wished to test, a capacitance-electrical voltage characteristic $C=f_1(V)$ is recorded, in which V is the potential difference applied between the surface of the integrated circuit and the semiconductor layer S and C is the capacitance of the oxide layer 0 and the semiconductor to the right of the tested point. To this integrated circuit point is then applied a voltage-temperature stress. The effect of the temperature stress is to activate the diffusion of the mobile ionized impurities of the oxide layer, whilst the effect of the voltage stress is to orient the displacement of the mobile ionized impurities activated in this way. The thermal stress is approximately 200° C. and the voltage stress, proportional to the oxide layer thickness, is approximately a few volts for an oxide thickness of 50 nm. In a third stage and after the return to ambient temperature, a further capacitance-voltage characteristic $C=f_2(V)$ of the integrated circuit point is recorded. This second characteristic differs from the first. In addition, the theoretical capacitance - voltage characteristic $C=f_1(V)$ is known. The value of the capacitance $C_{bp}$ corresponding to $V=0$ on this characteristic is called the "flat band capacitance".

In order to evaluate the number of mobile electrical charges, on each of the experimental characteristics, the flat band voltages $V_1$ and $V_2$ are recorded and are respectively given by the equations $C_{bp}=f_1(V_1)$ and $C_{bp}=f_2(V_2)$. The comparison between $V_1$ and $V_2$ gives an indication of the mobile electrical charges present in the oxide layer to the right of the tested point.

In order to realize a known checking or testing process, the expert uses a device which mainly incorporates a slab or plate support provided with heating means, on which is deposited a semiconductor plate or slab containing the integrated circuits to be tested and the electrical contact means formed by electrical points for electrically exciting the points of the integrated circuits to be tested. The known devices have several contact means. Thus, it is possible to record the number of mobile charges in the oxide at several points on an integrated circuit wafer. In general terms, the first stage of recording a capacitance-voltage characteristic is sequentially carried out for each point to be tested. This is followed by the second stage of the temperature-voltage stressing and is carried out simultaneously for the same points. This is followed by the third stage of recording a further capacitance-voltage characteristic and this is carried out sequentially for each of these points.

The main disadvantage of this device is that it only makes it possible to test, in practice, a few points on the integrated circuit wafer. Thus, the temperature-voltage stressing takes a long time, i.e. approximately 10 minutes. If it is wished to test more points of the integrated circuit board than there are electrical contact means, it is necessary to carry out a number of individual operations, involving in each case the temperature-voltage stressing of as many points to be tested as there are electrical contact means. Thus, the more points which have to be tested, the more time-consuming the operation. Thus, in practice, the expert limits the number of tested points to the number of available electric contact means, i.e. to a few units.

SUMMARY OF THE INVENTION

The object of the invention is to simultaneously bring about a temperature-voltage stressing of a random number of points to be tested on the integrated circuit wafer. For this purpose, the invention replaces the discrete temperature-voltage stressing means by a continuous means stressing the entire surface of the integrated circuit wafer Thus, the checking or testing time, which is largely dependent on the duration of the temperature-voltage stressing, becomes virtually independent of the number of points tested. It is therefore possible to envisage the carrying out of a cartography of the densities of the mobile electrical charge in the oxide of an integrated circuit wafer, i.e. of drawing a group of flat band isotension curves of the integrated circuit wafer by testing a large number of points, i.e. about a 100 or more. It can be advantageous in this case to automate the displacement of the electrical contact means between the individual points of the integrated circuit , as well as the recording of the flat band voltages at these points. Thus, this operation can be carried out in a much shorter time than with the prior art devices.

More specifically, the present invention relates to a device for checking the mobile electrical charges in a MOS integrated circuit comprising a wafer support provided with heating means, means for fixing a silicon integrated circuit wafer to said wafer support, at least one electrical contact means for applying a voltage to the points of the integrated circuits to be tested, a polarization means applying a potential difference between the two faces of the silicon wafer by means of two electrodes, each being in contact with one of the faces of said silicon wafer, wherein the first electrode is constituted by a conductive diaphragm, covering the silicon wafer, said first electrode being kept in contact with the silicon wafer by a pressure difference between its two faces, the second electrode being constituted by the electrically conductive wafer support.

According to a preferred embodiment, the diaphragm is fixed to an inverted U-shaped box, thus closing the cavity of said box. The device also comprises a means for producing an overpressure compared with the pressure outside the box within said cavity.

According to another preferred embodiment, the device comprises a gasket encircling the silicon wafer, placed on the wafer support and supporting an inverted U-shaped box, to which is fixed the diaphragm and it comprises a suction means producing a vacuum in the volume encircled by the gasket as compared with the pressure in the cavity of the box.

According to a secondary feature, the diaphragm is an electrically conductive metal sheet.

According to another secondary feature, the diaphragm is an electrically insulating sheet covered with an electrically conductive metal.

BRIEF DESCRIPTION OF THE DRAWINGS

The invention is described in greater detail hereinafter relative to non-limitative embodiments and the attached drawings, wherein show.

DETAILED DESCRIPTION OF THE INVENTION

Figure 1:
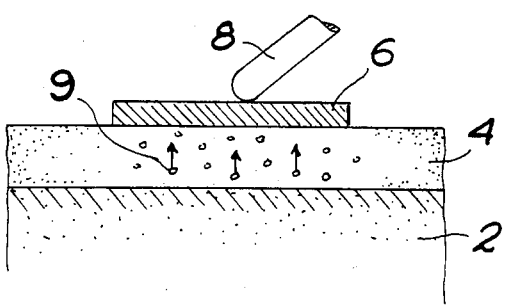
FIG. 1 the grid of a MOS integrated circuit and a contact means.

FIG. 1 shows the grid of a transistor of a MOS integrated element. It comprises a layer 2 constituted by a doped semiconductor, an oxide layer 4 in which the ionized impurities are mobile, and a metal layer 6. An electrical contact means 8, e.g. constituted by an electrical point makes it possible to raise the metal 6 to an electrical potential. By raising the semiconductor layer 2 to another potential, it is then possible to plot the capacitance-voltage characteristics and the electrical stressing of the area of the integrated circuit to the right of the metal layer 6.

The temperature stressing has the effect of activating the ionized impurities 9. The movement of these ionized impurities 9 is oriented by the voltage stress. The displacement direction of the ionized impurities 9, shown in the drawing by means of arrows, is of an arbitrary nature. It is dependent on the direction of the electric field prevailing in the oxide layer 4, i.e. the sign of the voltage stress applied and it is dependent on the sign of the mobile electrical charges.

Figure 2:
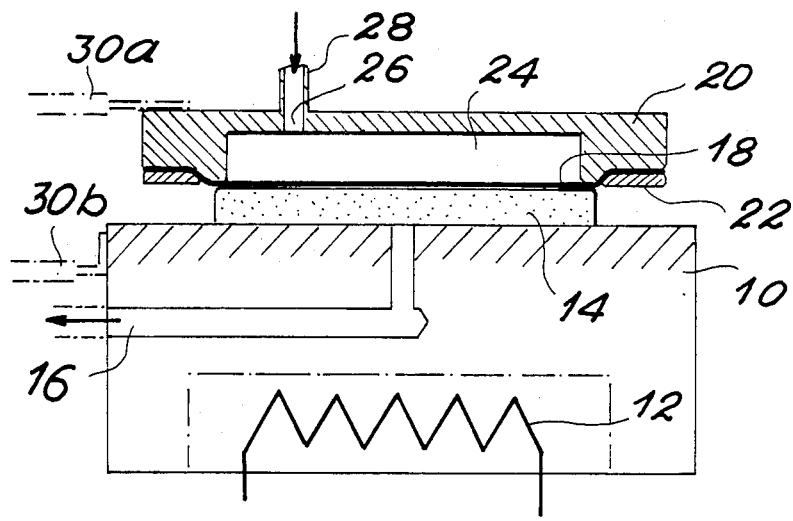
FIG. 2 an embodiment of the device according to the invention.

FIG. 2 shows an embodiment of the device according to the invention comprising a wafer support 10, provided with heating means 12, supporting a silicon wafer 14, in which has been inserted the integrated circuits to be tested. The silicon wafer 14 is fixed to the wafer support 10 by suction using a not shown pump, which is connected to a pipe 16 in wafer support 10. The complete device is under atmospheric pressure.

The temperature stressing of the silicon wafer 14 takes place by means of the thermally conductive wafer support 10, equipped with a heating means 12. The voltage stressing takes place by means of two electrical conductors 30a, 30b, the first applying a potential to the upper face of silicon wafer 14 by means of box 20 and conductive diaphragm 18 and the second applying a potential to the rear face of silicon wafer 14 by means of the electrically conductive wafer support 10. The rear face of silicon wafer 14 is optionally treated so as to bring about a better electrical conductivity. In order that the conductive diaphragm 18 correctly transmits the potential applied to it to the upper face of silicon wafer 14, it is necessary for it to be supported on the latter. In the case of FIG. 2, this is brought about by producing an overpressure between the face of the conductive diaphragm 18 not in contact with the silicon wafer 14 and the face of conductive diaphragm 18 in contact with silicon wafer 14. This is brought about by placing the conductive diaphragm 18 on an inverted U-shaped box 20. An overpressure is produced in cavity 24 of box 20 by supplying compressed air by means of a duct 28 traversing an orifice 26 in box 20. An overpressure of a few tenths of a bar is adequate if the device is under atmospheric pressure to bring about the necessary force for bearing the conductive diaphragm 18 on silicon wafer 14.

In practice, portion 22 of box 20 maintaining in place the conductive diaphragm 18 is slightly set back from the plane of said diaphragm, in order to prevent contact with the heating wafer support 10.

Figure 3:
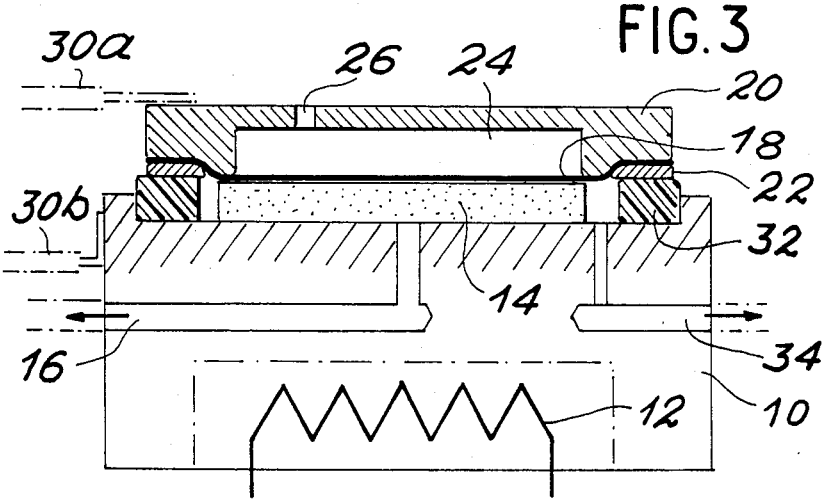
FIG. 3 another embodiment of the device according to the invention.

FIG. 3 shows another embodiment of the device according to the invention. As in the case of FIG. 2, this device comprises a wafer support 10, provided with a heating means 12, on which is deposited the silicon wafer 14 containing the integrated circuits to be tested, said wafer being fixed to the wafer support 10 by suction using a pump connected to pipe 16. As in FIG. 2, the conductive diaphragm 18 is fixed to an inverted U-shaped box 20 having an orifice 26. Thus, cavity 24 is at the same pressure as the complete device In order to apply conductive diaphragm 18 to the silicon wafer 14, a vacuum is produced on that side of the face of diaphragm 18 which is in contact with the silicon wafer 14 compared with the other face of diaphragm 18. In order to produce this vacuum, use is made of a gasket 32 encircling the silicon wafer 14. Gasket 32 can have a toroidal shape, i.e. it is in the form of an O-ring. It rests on the wafer support 10 and supports portion 22 of box 20. A pipe 34 in the wafer support 10 is connected on the one hand to the space encircled by gasket 32 and on the other to a not shown vacuum pump, which makes it possible to bring about the desired vacuum. A vacuum of a few tenths of a bar is adequate if cavity 24 of box 20 is at atmospheric pressure. However, the pressure in pipe 34 must exceed that in the pipe 16 to ensure the fixing of silicon wafer 14.

Several types of material can be used for making the conductive diaphragm 18. It can be constituted by a thin metal sheet, such as e.g. a stainless steel sheet, or can be made from an insulating sheet, e.g. of Kapton or Milar covered with a conductive coating, eg. of aluminium or copper. In the second case and if only one of the faces of the conductive diaphragm 18 is covered with a conductive coating, said face is electrically connected to box 20 in order that the potential supplied by conductor 30a to box 20 is transmitted thereto.

What is claimed is:

1. A device for checking mobile electrical charges in MOS integrated circuits made on a silicon wafer, said silicon integrated circuits wafer having a first flat face and a second flat face, said device comprising :
   a thermally and electrically conductive wafer support for supporting said silicon integrated circuits wafer, said first flat face being in contact with said support;
   fixing means for fixing said silicon integrated circuits wafer onto said wafer support;
   heating means connected to said wafer support for applying a thermal stress on said silicon integrated circuits wafer;
   at least one electrical contact means wherein each one of said at least one contact means raises a respective one point of the second flat face of said silicon integrated circuits wafer to be tested to an electrical potential, means for applying a second electrical potential to said wafer support, and wherein said device further comprises a polarization means for raising the entire second flat face to a third electrical potential, and a means for raising said wafer support to a fourth electrical potential wherein said polarization means and said electrical contact means do not function at the same time, said polarization means comprising an electrically conductive diaphragm applying means for applying said diaphragm on the entire second flat face of said silicon integrated circuits wafer and means for raising said diaphragm, and thereby said entire second flat face, to said electrical potential.

2. A device according to claim 1, wherein said electrically conductive diaphragm is fixed to an inverted U-shaped box, which thereby defines a closed cavity in said box, and wherein said applying means produces an overpressure within said cavity compared with the pressure outside the box.

3. A device according to claim 1, wherein said electrically conductive diaphragm is fixed to an inverted U-shaped box, wherein it comprises a gasket encircling the silicon integrated circuits wafer, placed on the wafer support and supporting the box, and wherein it comprises a suction means producing a vacuum in the volume encircled by the gasket compared with the pressure in the box cavity.

4. A device according to claim 1, wherein the electrically conductive diaphragm is an electrically conductive metal sheet.

5. A device according to claim 1, wherein the electrically conductive diaphragm is an electrically insulating sheet covered with an electrically conductive metal.

* * * * *